(12) United States Patent
Kim et al.

(10) Patent No.: US 9,236,484 B2
(45) Date of Patent: Jan. 12, 2016

(54) THIN FILM TRANSISTOR, AND PIXEL AND ORGANIC LIGHT EMITTING DISPLAY DEVICE HAVING THE SAME

(75) Inventors: Chang-Yeop Kim, Yongin (KR); Won-Kyu Kwak, Yongin (KR); Jin-Tae Jeong, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 151 days.

(21) Appl. No.: 13/289,164

(22) Filed: Nov. 4, 2011

(65) Prior Publication Data

US 2013/0002616 A1 Jan. 3, 2013

(30) Foreign Application Priority Data

Jun. 28, 2011 (KR) .................. 10-2011-0063169

(51) Int. Cl.
  *H01L 29/786* (2006.01)
  *H01L 27/12* (2006.01)
  *G09G 3/32* (2006.01)

(52) U.S. Cl.
  CPC .......... *H01L 29/78615* (2013.01); *G09G 3/325* (2013.01); *H01L 27/1214* (2013.01); *G09G 3/3233* (2013.01); *G09G 2300/0876* (2013.01); *G09G 2310/0262* (2013.01)

(58) Field of Classification Search
  None
  See application file for complete search history.

(56) References Cited

U.S. PATENT DOCUMENTS

| 4,984,041 | A  | * | 1/1991  | Hack et al. ................ 257/60 |
| 6,100,751 | A  | * | 8/2000  | De et al. ................. 327/534 |
| 6,537,890 | B2 | * | 3/2003  | Joo et al. ................ 438/404 |
| 6,936,504 | B2 | * | 8/2005  | Joo et al. ................ 438/166 |
| 7,166,900 | B1 | * | 1/2007  | Mun et al. ............... 257/467 |
| 7,834,397 | B2 | * | 11/2010 | Park et al. .............. 257/347 |
| 7,847,765 | B2 | * | 12/2010 | Park et al. ............... 345/82 |
| 2003/0201497 | A1 | * | 10/2003 | Inoue et al. .............. 257/351 |
| 2008/0036386 | A1 | * | 2/2008  | Shin et al. ............. 315/169.3 |
| 2008/0062088 | A1 | * | 3/2008  | Chang et al. ............. 345/76 |
| 2008/0135838 | A1 | * | 6/2008  | Park et al. ............... 257/40 |
| 2010/0044711 | A1 | * | 2/2010  | Imai .................... 257/59 |
| 2010/0117155 | A1 | * | 5/2010  | Kitakado ................ 257/368 |
| 2010/0244104 | A1 | * | 9/2010  | Makiyama et al. ......... 257/279 |
| 2011/0025659 | A1 | * | 2/2011  | Kwak et al. .............. 345/205 |
| 2013/0002632 | A1 | * | 1/2013  | Choi .................... 345/211 |

FOREIGN PATENT DOCUMENTS

| KR | 10-2006-0072784 A | 6/2006 |
| KR | 10-2008-0000294 A | 1/2008 |
| KR | 10-2009-0072885 A | 7/2009 |

* cited by examiner

*Primary Examiner* — Waseem Moorad
*Assistant Examiner* — Sujit Shah
(74) *Attorney, Agent, or Firm* — Knobbe, Martens, Olson & Bear, LLP

(57) ABSTRACT

A thin film transistor, a pixel, and an organic light emitting diode (OLED) display including the same are disclosed. The thin film transistor includes a connection to the channel region separate from connections to the source and drain.

14 Claims, 10 Drawing Sheets

THIN FILM TRANSISTOR, AND PIXEL AND ORGANIC LIGHT EMITTING DISPLAY DEVICE HAVING THE SAME

CROSS-REFERENCE TO RELATED APPLICATIONS

This application claims priority to and the benefit of Korean Patent Application No. 10-2011-0063169 filed in the Korean Intellectual Property Office on Jun. 28, 2011, the entire contents of which are incorporated herein by reference.

BACKGROUND

1. Field

The disclosed technology relates to a thin film transistor, and a pixel and an organic light emitting diode (OLED) display including the same, and in detail, relates to a thin film transistor with an improved hysteresis characteristic, and a pixel and an organic light emitting diode (OLED) display including the same.

2. Description of the Related Technology

Various display devices for displaying a motion picture and text have been developed. Such devices include, for example, a flat panel display such as a liquid crystal display (LCD), a field emission display (FED), a plasma display panel (PDP), or an organic light emitting diode (OLED) display.

Among the flat panel displays, the organic light emitting diode display, which displays images by using organic light emitting diodes (OLEDs) that generate light by recombining electrons and holes, has a fast response speed, has low power consumption, and has excellent emission efficiency, luminance, and viewing angle, such that it has recently been favored.

In general, the organic light emitting diode (OLED) display may be classified as either a passive matrix OLED (PMOLED) display or an active matrix OLED (AMOLED) display according to a method of driving an organic light emitting diodes (OLEDs). An active matrix display selectively turns the pixels on and off and is mainly used in because of resolution, contrast, and operation speed.

Performance of the flat panel display is determined by various metrics, such as whether a clear and clean image is displayed without motion blur when displaying a motion picture or moving text with the motion picture. Motion blur is generated due to the reaction speed of liquid crystal in a case of the liquid crystal display (LCD).

However, in an organic light emitting diode (OLED) display, atoms of the organic emission layer are excited and light emits, so motion blur due to the reaction speed is not generated, however the motion blur is generated by a delayed response time because of a hysteresis characteristic of a driving transistor controlling a current applied to the organic emission layer.

In detail, in an organic light emitting diode (OLED) display, a driving transistor transmits a driving current of a data voltage level according to a data signal to the organic emission layer, and the gray level of the current data may not be displayed due to the hysteresis characteristic of the driving transistor. Particularly, when the current amount is quickly changed from a low grayscale to a high grayscale, or from the high grayscale to the low grayscale, the current corresponding to the grayscale change is normally transmitted according to the hysteresis characteristic of the driving transistor and the normal luminance is not displayed such that the motion blur appears.

Accordingly, research into the improvement of the hysteresis characteristic of the driving transistor to display a clear image of high display quality by eliminating motion blur in the organic light emitting diode (OLED) display is required.

The above information disclosed in this Background section is only for enhancement of understanding of the background and therefore it may contain information that does not form the prior art that is already known in this country to a person of ordinary skill in the art.

SUMMARY OF CERTAIN INVENTIVE ASPECTS

One inventive aspect is a thin film transistor, including a semiconductor layer formed on a substrate, a first electrode connected to a first region of the semiconductor layer, a second electrode connected to a second region different from the first region of the semiconductor layer, and a third electrode connected to a third region of the semiconductor layer different from the first region and the second region. The third electrode is configured to apply a first voltage to the semiconductor layer through the third region.

Another inventive aspect is a pixel including an organic light emitting diode (OLED), and a driving transistor. The driving transistor includes a source electrode and a drain electrode respectively connected to a source region and a drain region, a gate electrode connected to a gate metal layer formed separately from the semiconductor layer, and a bias electrode connected to a portion of a channel region of the semiconductor layer. The driving transistor is configured to transmit a driving current according to a data signal to the organic light emitting diode (OLED). The pixel also includes a switching transistor transmitting a data signal to the source electrode of the driving transistor corresponding to a first scan signal, an initialization transistor configured to apply an initialization voltage to the gate electrode of the driving transistor according to a second scan signal during an initialization period, an assistance transistor configured to apply an assistance voltage to the bias electrode of the driving transistor according to the second scan signal during the initialization period, and a storage capacitor including a first electrode connected to the gate electrode of the driving transistor and a second electrode connected to a first power source voltage.

Another inventive aspect is an organic light emitting diode (OLED) display including a display unit which has a plurality of pixels connected to a plurality of scan lines transmitting a plurality of scan signals, a plurality of data lines transmitting a plurality of data signals, and a plurality of light emission control lines transmitting a plurality of light emission control signals. The display also includes a scan driver transmitting a plurality of scan signals, a data driver transmitting a plurality of data signals, and a light emission driver transmitting a plurality of light emission control signals. The plurality of pixels respectively include an organic light emitting diode (OLED), and a driving transistor. The driving transistor includes a source electrode and a drain electrode respectively connected to a source region and a drain region, a gate electrode connected to a gate metal layer formed separately from the semiconductor layer, and a bias electrode connected to a portion of a channel region of the semiconductor layer. The driving transistor is configured to transmit a driving current according to a data signal to the organic light emitting diode (OLED). The pixels also respectively include a switching transistor configured to transmit a data signal to the source electrode of the driving transistor corresponding to a first scan signal, an initialization transistor configured to apply an initialization voltage to the gate electrode of the driving transistor according to a second scan signal during an initialization period, an assistance transistor configured to apply an assistance voltage to the bias electrode of the driving transistor according to the second scan signal during the initialization period, and a storage capacitor including a first electrode connected to the gate electrode of the driving transistor and a second electrode connected to a first power source voltage.

DETAILED DESCRIPTION OF CERTAIN INVENTIVE EMBODIMENTS

Figure 1:
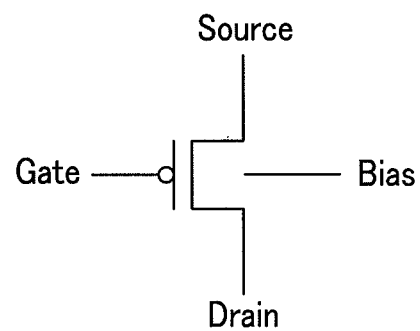
FIG. 1 is a schematic view of a thin film transistor according to an exemplary embodiment.

Certain aspects are described more fully hereinafter with reference to the accompanying drawings, in which exemplary embodiments are shown. As those skilled in the art would realize, the described exemplary embodiments may be modified in various different ways, all without departing from the spirit or scope of the present invention.

Further, like reference numerals generally denote like components throughout several exemplary embodiments. A first exemplary embodiment will be representatively described, and, in some cases, only components other than those of the first exemplary embodiment will be described in other exemplary embodiments. The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a schematic view of a thin film transistor according to an exemplary embodiment.

In general, a thin film transistor (TFT) is a MOSFET, and includes a source terminal, a gate terminal, and a drain terminal and is a three terminal element which doesn't use a bulk connection, unlike a metal-oxide-semiconductor (MOS) transistor. A main function of the thin film transistor is a switching operation, wherein a current flowing between the source and the drain controls the voltage applied to the gate as the third electrode, and thereby the on/off switching operation is executed.

Each pixel of the active matrix organic light emitting diode (OLED) display controls the driving current amount of the OLED by the thin film transistor included in the pixel, and thereby the pixel emits light with a luminance corresponding to the data signal transmitted to each pixel. Particularly, a driving thin film transistor controlling the driving current transmitted to the organic emission layer in a plurality of pixels of the organic light emitting diode (OLED) display has a hysteresis characteristic according to a driving current change between the previous frame and the current frame during expression of grayscales according to the data voltage such that the hysteresis characteristic is a cause of the motion blur during image expression.

Accordingly, to eliminate the motion blur due to the hysteresis characteristic, as shown in FIG. 1, the thin film transistor according to an exemplary embodiment adds a bias terminal connected to a channel region between a source terminal and a drain terminal. Referring to FIG. 1, the thin film transistor is a P-type structure, however it is not limited thereto, and an N-type thin film transistor may be connected to a bias terminal.

Figure 2:
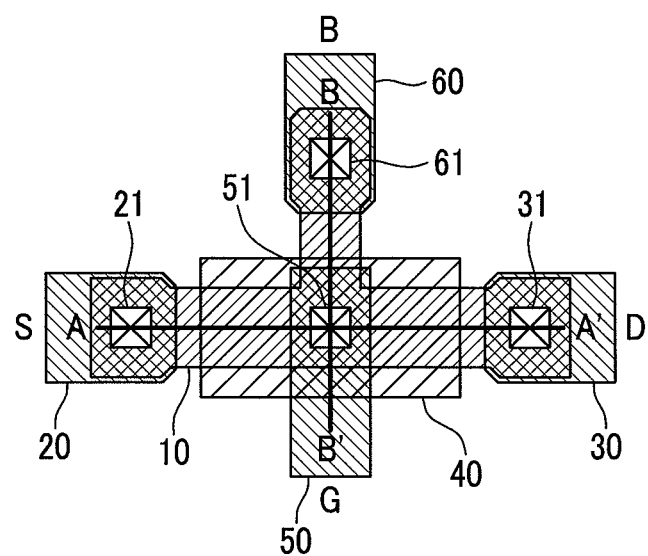
FIG. 2 is a layout view of a thin film transistor according to an exemplary embodiment.

FIG. 2 is a layout view of a thin film transistor according to an exemplary embodiment, and particularly is a layout view of the thin film transistor shown in FIG. 1. In the layout view of FIG. 2, a lowest transparent insulation substrate and a buffer layer that can be deposited thereby are not shown, and a semiconductor layer 10 used as an activation layer and configurations thereof are shown.

The semiconductor layer 10 is an activation or active layer including a region injected with P-type or N-type semiconductor impurity ions and a region where impurity ions are not injected.

In detail, the regions under the regions where a source electrode 20 and a drain electrode 30 are respectively positioned are semiconductor layer regions where the P-type or N-type semiconductor impurity ions are doped. The semiconductor layer region connected to the source electrode 20 is referred to as a source region, and the semiconductor layer region connected to the drain electrode 30 is referred to as a drain region. Also, a region disposed between the source region and the drain region among the semiconductor layer 10 is referred to as a channel region where the semiconductor impurity is injected.

The shape of the semiconductor layer 10 is not limited, however the shape of the semiconductor layer 10 according to an exemplary embodiment of may be a "T" shape where a portion of the channel region excluding the source region and the drain region is protruded. Hereafter, the protruded portion of the channel region is referred to as a bias terminal connection. The protruded channel region of the semiconductor layer 10, particularly a region connected to a bias electrode 60 through a contact hole 61, is referred to as a bias region.

Also, referring to FIG. 2, a gate metal layer 40 is deposited on the semiconductor layer 10. In detail, the gate metal layer 40 is deposited on the channel region of the semiconductor layer 10 where the impurity ions are not doped. Although not shown in FIG. 2, an insulation layer made of an insulating material is formed between the semiconductor layer 10 and the gate metal layer 40 for disconnection therebetween. After a middle layer (not shown) as an insulation layer is again formed on the substrate including the gate metal layer 40, each electrode is formed.

That is, the source electrode 20 connected to the source region of the semiconductor layer 10, the drain electrode 30 connected to the drain region of the semiconductor layer 10, the bias electrode 60 connected to the bias region of the semiconductor layer 10, and a gate electrode 50 connected to the gate metal layer 40 are formed. The source electrode 20, the drain electrode 30, and the bias electrode 60 are connected to the semiconductor layer 10 through contact holes 21, 31, and 61 formed by patterning and etching the middle layer and the gate insulation layer. Also, the gate electrode 50 is connected to the gate metal layer 40 through a contact hole 51 formed by patterning and etching the middle layer. The structure of the thin film transistor of the exemplary embodiment according to FIG. 2 may be further comprehended in detail through FIG. 3 and FIG. 4 as cross-sectional views respectively corresponding to solid lines A-A' and B-B' represented in the layout view of FIG. 2.

Figure 3:
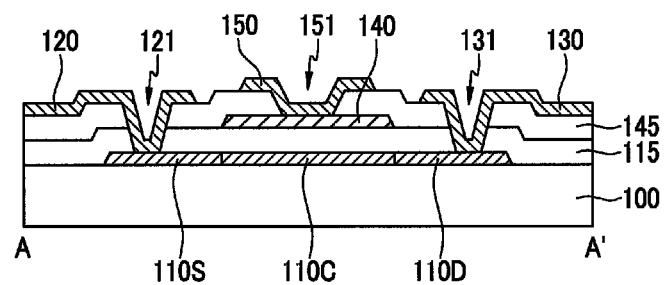
FIG. 3 is a cross-sectional view of the thin film transistor taken along the solid line A-A' in the layout view of FIG. 2.

FIG. 3 is a cross-sectional view of the thin film transistor taken along the solid line A-A' in the layout view of FIG. 2. That is, FIG. 3 is the cross-sectional view of the thin film transistor corresponding to the solid line A-A' passing the source electrode 20, the gate electrode 50, and the drain electrode 30.

Referring to FIG. 3, a semiconductor layer 110 doped with the semiconductor impurity ions is formed on a substrate 100. The substrate 100 may be formed of a transparent insulation substrate such as a glass substrate, however this is one exemplary embodiment and is not limited thereto.

To form the semiconductor layer 110, an amorphous silicon layer is formed on the substrate 100 and patterned through an etching process. To form the semiconductor layer 110 with the amorphous silicon is one exemplary embodiment, and it may be formed with a polysilicon layer. The semiconductor layer 110 includes a source region 110S and a drain region 110D doped with the semiconductor impurity ions, and a channel region 110C where the semiconductor impurity ions are not doped. The doping method or the sequence of the impurity ions is not limited, and according to the deposition method of the thin film transistor, after the regions are firstly divided, the impurity ions may be injected, or they may be injected by using a gate metal layer 140 that is deposited as a doping mask.

A gate insulation layer 115 is formed on the substrate including the semiconductor layer 110. The gate insulation layer 115 as a layer to prevent electric connection between the semiconductor layer 110 and the gate metal layer 140 that will be deposited is not limited by a specific material, and may be formed with a general insulating material.

After forming the gate insulation layer 115, the gate metal layer 140 is formed on a predetermined region where the semiconductor layer 110 is positioned. In detail, the gate metal layer 140 may be formed in the predetermined region on the channel region 110C between the source region 110S and the drain region 110D of the semiconductor layer 110.

According to a disclosed exemplary embodiment of the semiconductor process, a process of doping the impurity ions to the source region 110S and the drain region 110D of the semiconductor layer 110 may be executed by using the gate metal layer 140 as a mask after forming the gate insulation layer 115 and gate metal layer 140. The gate metal layer 140 may be formed of a metallic material, particularly a material such as MoW and an Al-based material among the metallic materials when considering a contact property close to the layer, and surface flatness and processibility.

On the gate metal layer 140 and the gate insulation layer 115 formed with the gate metal layer 140, at least a middle layer 145 as an insulation layer is formed. A metal forming the middle layer 145 is not limited and it may be formed of a general insulating material.

After forming the middle layer 145, the predetermined region of the middle layer 145 and the gate insulation layer 115 to expose the portion of the source region 110S and the drain region 110D of the semiconductor layer 110 is etched to form a contact hole. That is, a source region contact hole 121 exposing the source region 110S of the semiconductor layer 110 and a drain region contact hole 131 exposing the drain region 110D of the semiconductor layer 110 are formed.

Next, a source electrode 120 and a drain electrode 130 are respectively formed on the source region contact hole 121 and the drain region contact hole 131. The source electrode 120 and the drain electrode 130 may be made of the metallic material that is electrically connected, and particularly may be made of a metal such as MoW, however it is not limited thereto. The source electrode 120 and the drain electrode 130 may be heat-treated later for smooth ohmic contact along with the semiconductor layer 110. On the other hand, a predetermined region of the middle layer 145 formed on the gate metal layer 140 is etched to form a gate region contact hole 151 exposing the gate metal layer 140. A gate electrode 150 is formed on the gate region contact hole 151.

Figure 4:
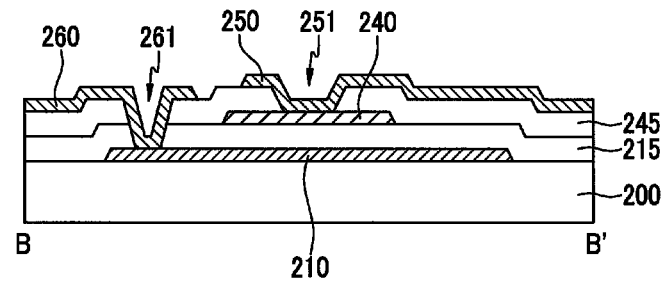
FIG. 4 is a cross-sectional view of the thin film transistor taken along the solid line B-B' in the layout view of FIG. 2.

FIG. 4 is a cross-sectional view of the thin film transistor corresponding to the solid line B-B' of the layout view of FIG. 2, and corresponding to the solid line B-B' passing the gate electrode 50 and the bias electrode 60. Referring to FIG. 4, a semiconductor layer 210, a gate insulation layer 215, a gate metal layer 240, a middle layer 245, and electrodes are formed on a substrate 200 and are the same as the corresponding structures of FIG. 3.

FIG. 4 is a cross-sectional view of the thin film transistor for the solid line passing a bias electrode 260 and a gate electrode 250, and the bias electrode 260 formed on the middle layer 245 is connected to the semiconductor layer 210 through a bias contact hole 261. Particularly, the semiconductor layer 210 connected to the bias electrode 260 corresponds to the bias region defined above. The bias region of the semiconductor layer 210 corresponds to the channel region where the gate metal layer 240 is deposited via the gate insulation layer 215. According to an exemplary embodiment, an assistance voltage applied through the bias electrode 260 is transmitted to the channel region of the semiconductor layer 210.

The bias contact hole 261 exposing a portion of the bias region of the semiconductor layer 210 is formed by simultaneously etching the middle layer 245 and the gate insulation layer 215. On the other hand, the gate electrode 250 is deposited after forming the gate contact hole 251 exposing the gate metal layer 240, and as shown in FIG. 3, the gate contact hole 251 is formed by etching a portion of the region where the gate metal layer 240 is positioned among the region of the middle layer 245.

Figure 5:
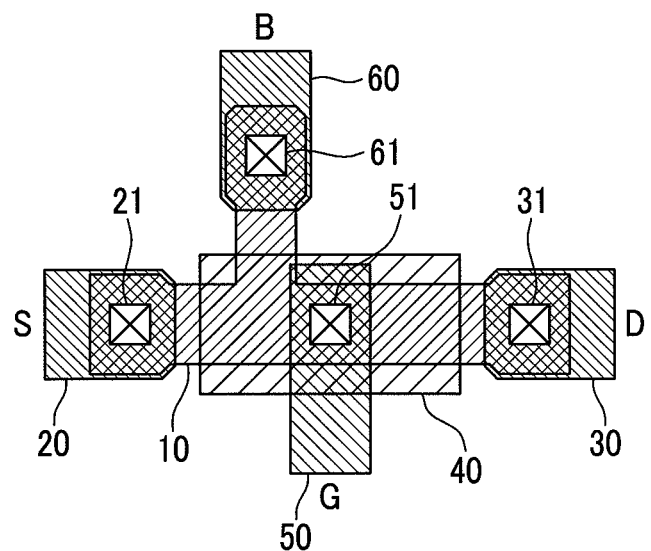
FIG. 5 and FIG. 6 are layout view of the thin film transistor according to another exemplary embodiment of FIG. 2.
Figure 6:
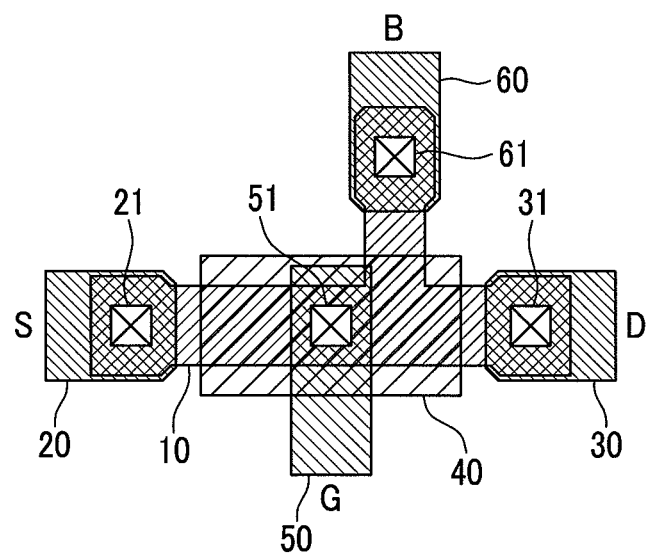

Various structures in addition to the structure of the thin film transistor according to the exemplary embodiment of FIG. 2 may be formed, and FIG. 5 and FIG. 6 are exemplary embodiments having different structures.

In the thin film transistor of FIG. 5 and FIG. 6, the transistor is formed with a "T" shape in the channel region of the semiconductor layer 10, that is, the bias terminal connection, is not positioned at the center as in FIG. 2, but is offset to the left side or the right side. However, the bias terminal connection is disposed with the width of the channel region of the semiconductor layer 10 and does not overlap the source region or the drain region of the semiconductor layer 10.

As shown in FIG. 5 and FIG. 6, the bias electrode 60 is formed on the bias terminal connection of the semiconductor layer 10, and they are connected through the contact hole 61. Accordingly, the assistance voltage applied to the bias electrode 60 is transmitted to the channel region of the semiconductor layer 10 through the bias terminal connection in the source region side or the drain region side of the semiconductor layer 10.

Figure 7:
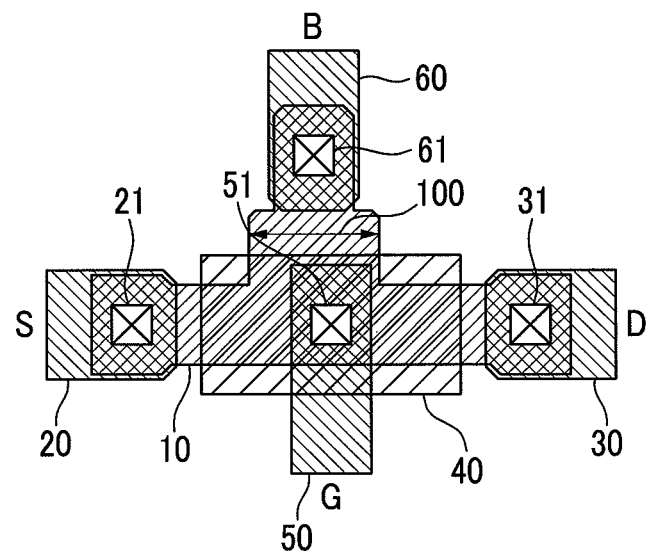
FIG. 7 to FIG. 9 are layout views of a thin film transistor according to another exemplary embodiment.
Figure 8:
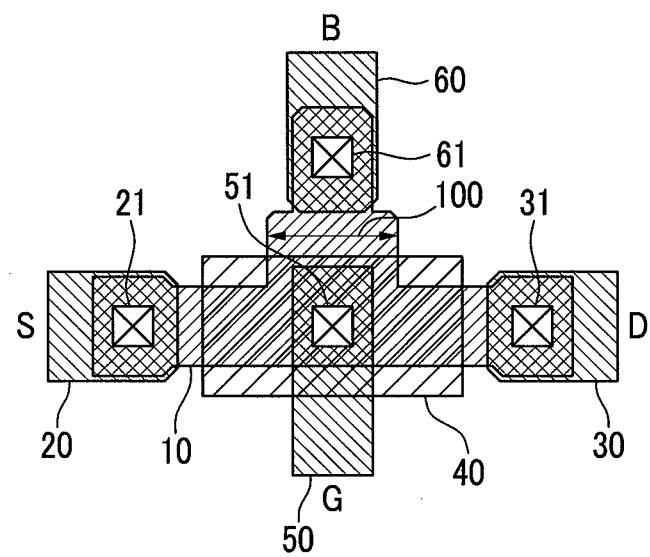
Figure 9:
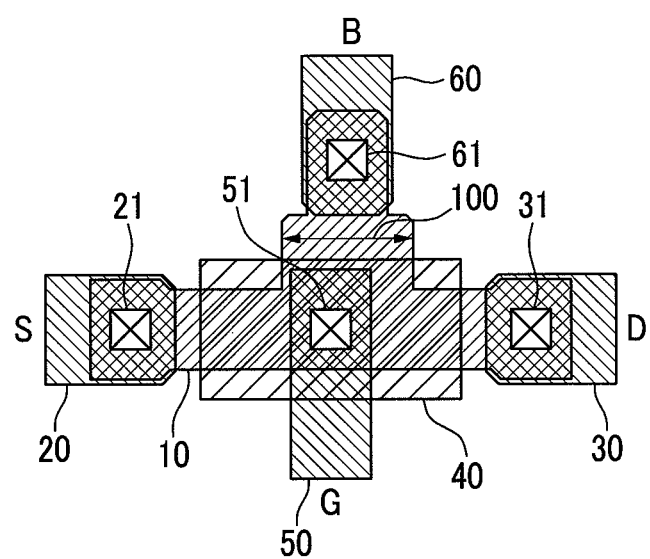

FIG. 7 to FIG. 9 show a structure of a thin film transistor according to another exemplary embodiment, and compared with the structure of the thin film transistor of FIG. 2, FIG. 5, and FIG. 6, it may be confirmed that the width of the bias region of the semiconductor layer 10 connected to the bias electrode 60 is less than the width 100 of the channel region of the semiconductor layer 10.

In detail, in the thin film transistor of FIG. 7 to FIG. 9, the width 100 of the bias terminal connection of the semiconductor layer 10 is wider than the width of the bias terminal connection of the thin film transistor of FIG. 2, FIG. 5, and FIG. 6. Accordingly, the width of the bias region of the semiconductor layer 10 connected directly to the bias electrode 60 is relatively smaller than the width 100 of the bias terminal connection.

In the exemplary embodiments of FIG. 7 to FIG. 9, the width of the channel region of the semiconductor layer 10 is relatively wide such that process convenience may be realized and the voltage transmitted through the bias region connected to the channel region may be easily transmitted.

In FIG. 7 to FIG. 9, the width 100 of the bias terminal connection is not limited, however it is larger than at least the width of the bias region of the semiconductor layer 10 or the width of the bias electrode 60 and may be smaller than the length of the channel region of the semiconductor layer 10. Here, the length of the channel region means a remaining length excluding the length of the source region and the drain region among the entire length of the semiconductor layer 10.

In the structure of the thin film transistor of FIG. 7, the width 100 of the bias terminal connection is expanded in the direction of the source electrode 20 with reference to the gate electrode 50. In the structure of the thin film transistor of FIG. 8, the width 100 of the bias terminal connection is equally expanded in both directions of the source electrode 20 and the drain electrode 30 with reference to the gate electrode 50.

In the structure of the thin film transistor of FIG. 9, the width 100 of the bias terminal connection is expanded in the direction of the drain electrode 30 with reference to the electrode 50. The shapes of FIG. 7 to FIG. 9 respectively show one exemplary embodiment, and that the width of the bias terminal connection may be expanded in various exemplary embodiments.

Figure 10:
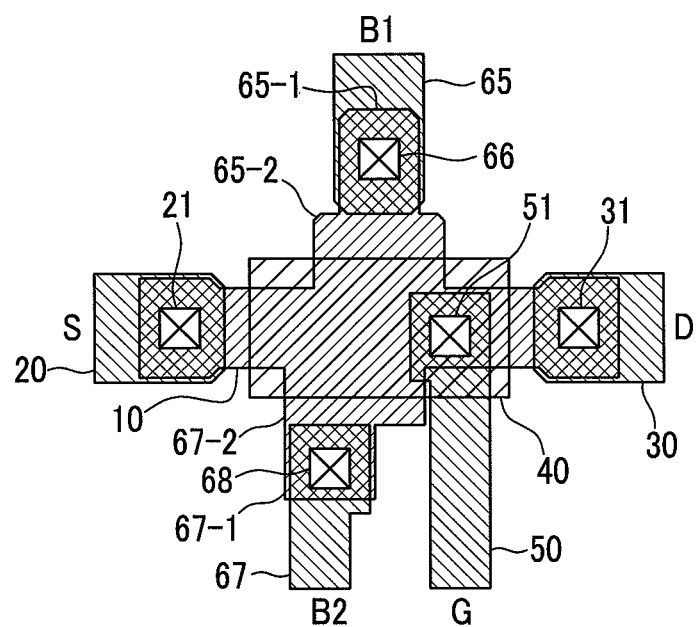
FIG. 10 is a layout view of a thin film transistor according to another exemplary embodiment.

FIG. 10 is a layout view of a thin film transistor according to another exemplary embodiment. In the thin film transistor of FIG. 10, differently from the thin film transistor according to the above-described exemplary embodiments, in addition to one bias electrode B1 connected to the bias region leading to the channel region of the semiconductor layer, at least one bias electrode B2 is additionally formed. That is, the shape of the semiconductor layer 10 is not the "T" shape, but is an approximate cross (+) shape. The semiconductor layer 10 includes the source region and the drain region formed at the ends and the channel region protruded up and down with reference to the source region and the drain region.

Referring to FIG. 10, a first bias electrode 65 is formed on a first bias region 65-1 connected to an upper protruded portion 65-2 (referred to as the first bias terminal connection) of the channel region of the semiconductor layer 10 on which the source electrode 20 and the drain electrode 30 are formed. Also, a second bias electrode 67 is formed on a second bias region 67-1 connected to the lower protruded portion (referred to as the second bias terminal connection) 67-2 of the channel region of the semiconductor layer 10. In further detail, the first bias electrode 65 is connected to the first bias region 65-1 of the semiconductor layer 10 through a bias contact hole 66. The first bias region 65-1 is connected to the channel region through the first bias terminal connection 65-2.

On the other hand, the second bias electrode 67 is connected to the second bias region 67-1 of the semiconductor layer 10 through a bias contact hole 68. The second bias region 67-1 is connected to the channel region through the second bias terminal connection 67-2. The widths of the first bias terminal connection 65-2 and the second bias terminal connection 67-2 are not limited, however as shown in the exemplary embodiment of FIG. 10, they may be wider than the width of the bias regions 65-1 and 67-1.

Referring to FIG. 10, the width of the first bias terminal connection 65-2 and the second bias terminal connection 67-2 is expanded such that the gate electrode 50 may be formed to lean in the direction of the source electrode 20 or the drain electrode 30. In FIG. 10, there is one added bias electrode B2, however it is not limit thereto and may be formed with various shapes. In the exemplary embodiment of FIG. 10, one and more bias electrodes are added to the thin film transistor such that the predetermined bias voltage may be further correctly and surely applied to the channel region of the semiconductor layer before writing the data signal.

Figure 11:
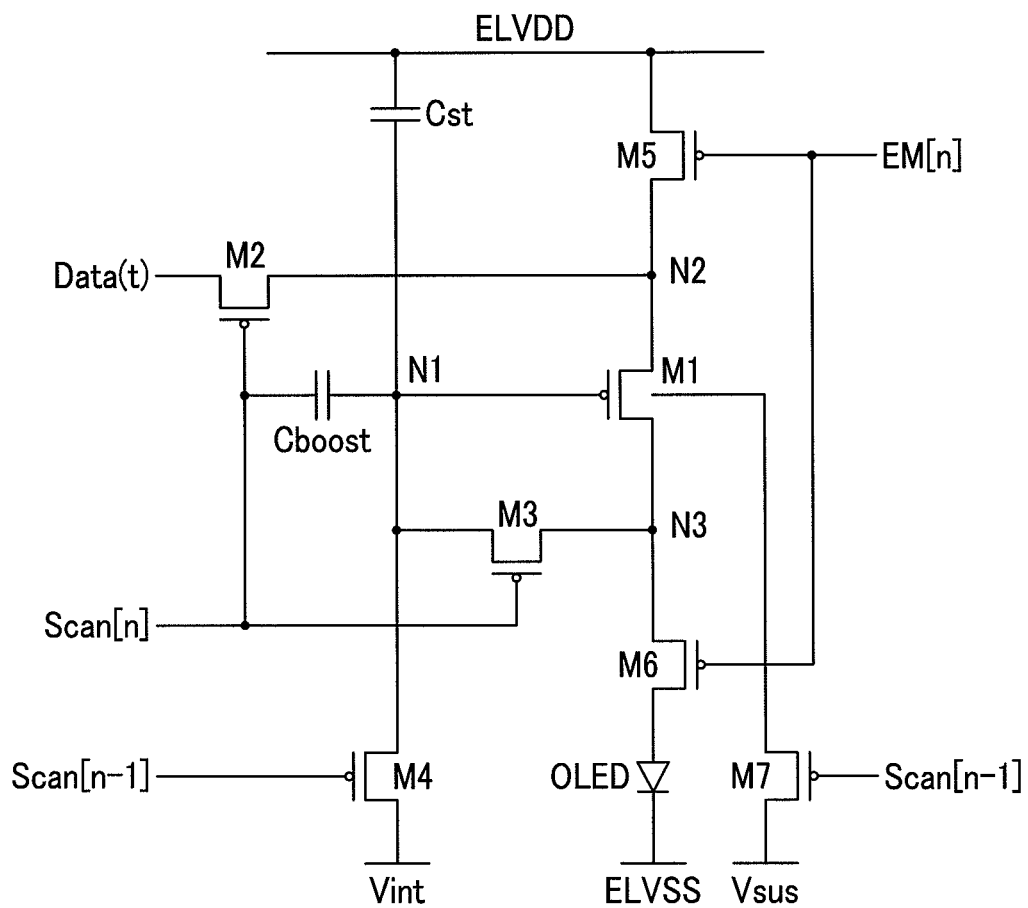
FIG. 11 is a circuit diagram of a pixel including a thin film transistor according to an exemplary embodiment.

FIG. 11 is a circuit diagram of a pixel including a thin film transistor according to an exemplary embodiment. In detail, the driving transistor M1 supplying the driving current according to a predetermined data signal among the thin film transistors M1 to M7 forming the circuit diagram of FIG. 11 consists of the thin film transistor as described herein. That is, in the circuit diagram of FIG. 11, the thin film transistors M2 to M7 are all thin film transistors having a three terminal structure of a gate, a source, and a drain, however the driving transistor M1 consists of the thin film transistor having a four terminal structure of the gate, the source, the drain, and the bias.

The pixel according to an exemplary embodiment is connected to the second scan line transmitting a second scan signal Scan [n−1] to maintain a voltage between the gate and the source and the voltage between the source and the drain of the driving transistor M1 at a predetermined voltage by applying an initialization voltage Vint to the gate electrode of the driving transistor M1 during the initialization period and an assistance voltage Vsus to the bias electrode of the driving transistor M1 as well as a first scan line transmitting a first scan signal Scan [n] activating the pixel to transmit the data signal.

Also, the pixel according to an exemplary embodiment is connected to a corresponding data line transmitting a data signal Data(t) corresponding to an external video signal and a light emission control line transmitting a light emission control signal EM[n] controlling light emitting of the pixel.

The pixel shown in FIG. 11 includes an organic light emitting diode (OLED), a driving transistor M1 connected to an anode of the organic light emitting diode (OLED), a switching transistor M2 connected to the source electrode of the driving transistor M1, a first light emission control transistor M5 connected between a node N2 connected with the driving transistor M1 and switching transistor M2 and the first power source voltage ELVDD, an assistance transistor M7 connected to the bias electrode connected to the channel region of the driving transistor M1 and transmitting a predetermined assistance voltage Vsus to the bias electrode, and a storage capacitor Cst positioned between the driving transistor M1 and the first power source voltage ELVDD.

The pixel may further include an initialization transistor M4 transmitting an initialization voltage Vint during an initialization period. The pixel may further include a threshold voltage compensation transistor M3 diode-connecting the driving transistor M1 to compensate the threshold voltage of the driving transistor M1. The pixel may further include at least one second light emission control transistor M6 connected to the anode of the organic light emitting diode (OLED) and controlling the light emitting according to the driving current of the organic light emitting diode (OLED) as well as the first light emission control transistor M5. Also, the pixel may further include a boost capacitor Cboost connected between the node N1 connected with the gate electrode of the driving transistor M1 and the gate electrode of the switching transistor M2.

The exemplary embodiment of the circuit diagram of the pixel in which the thin film transistor according to an exemplary embodiment is applied to the driving transistor may be varied, and is not limited to FIG. 11.

The organic light emitting diode (OLED) of the pixel includes the anode and the cathode, and emits light by the driving current according to the corresponding data signal. The driving current according to the data signal is compensated so as to not be affected by the threshold voltage of the driving transistor M1 of the pixel.

In the circuit diagram of the pixel, the driving transistor M1 as the four terminal transistor includes the source electrode connected to the node N2, the drain electrode connected to the node N3 connected with the threshold voltage compensation transistor M3, the gate electrode connected to the node N1 connected with the boost capacitor Cboost, and the bias electrode connected with the assistance transistor M7. The driving transistor M1 receives the data signal through the switching transistor M2 connected to the node N2.

The driving transistor M1 transmits the driving current corresponding to the voltage difference between the source electrode and the gate electrode to the organic light emitting diode (OLED), thereby emitting light.

According to an exemplary embodiment, before writing the data signal to the driving transistor M1, a predetermined initialization voltage Vint and a predetermined assistance voltage Vsus are respectively applied to the gate electrode of the driving transistor M1 and the bias electrode. The switching transistor M2 includes the source electrode connected to the data line and receiving the data signal Data(t), the drain electrode connected to the node N2, and the gate electrode connected to the corresponding scan line and receiving the scan signal Scan[n]. If the scan signal Scan[n] is transmitted through the corresponding scan line such that the switching transistor M2 is turned on, the data signal Data(t) is transmitted to the node N2 and the data voltage Vdata corresponding to the data signal Data(t) is transmitted to the source electrode of the driving transistor M1. The scan signal Scan[n] is also simultaneously transmitted to the gate electrode of the threshold voltage compensation transistor M3.

The threshold voltage compensation transistor M3 is connected between the gate electrode and the drain electrode of the driving transistor M1 and is turned on during a period that the scan signal Scan[n] is transmitted with the gate-on voltage level such that the driving transistor M1 is diode-connected. Thus, the voltage Vdata−Vth of which the data voltage applied to the source electrode of the driving transistor M1 is dropped by the threshold voltage of the driving transistor M1 is applied to the gate electrode of the driving transistor M1. The gate electrode of the driving transistor M1 is connected to one terminal of the storage capacitor Cst such that the voltage Vdata−Vth is maintained by the storage capacitor Cst. The voltage Vdata−Vth reflected by the threshold voltage Vth of the driving transistor M1 is applied to the gate electrode and is maintained such that the driving current flowing to the driving transistor M1 does not receive the influence according to the threshold voltage of the driving transistor M1.

The initialization transistor M4 includes the gate electrode connected to the previous scan line of the corresponding scan line and receiving the scan signal Scan[n−1], the source electrode connected to a voltage source transmitting the initialization voltage Vint, and the drain electrode connected to the gate electrode of the driving transistor M1. If the scan signal Scan[n−1] is transmitted to the initialization transistor M4 with the gate-on voltage level during the initialization period before writing the data signal, the initialization transistor M4 is turned on, at this time, the initialization voltage Vint is applied to the gate electrode of the driving transistor M1 during the initialization period such that the gate electrode of the driving transistor M1 is initialized to the initialization voltage.

On the other hand, the scan signal Scan[n−1] is transmitted to the gate electrode during the initialization period in which the scan signal Scan[n−1] is transmitted with the gate-on voltage level such that the assistance transistor M7 is turned on. Thus, the bias electrode of the driving transistor M1 is applied with the assistance voltage Vsus through the turned on assistance transistor M7. The scan signal Scan[n] and the light emission control signal EM[n] are both transmitted with the gate-off voltage level during the initialization period in which the scan signal Scan[n−1] is transmitted with the gate-on voltage level such that the source and drain of the driving transistor M1 are both floated. Accordingly, the assistance voltage Vsus is applied to the bias electrode connected to the bias region following the channel region of the driving transistor M1 during the initialization period before writing the data, and the source voltage and the drain voltage of the driving transistor M1 may be set up as the assistance voltage. At this time, the difference between the source voltage and the drain voltage of the driving transistor M1 becomes approximately zero.

For the driving transistor M1 of all pixels, in the state in which the source voltage and the drain voltage of the driving transistor M1 are set up as the assistance voltage, the data voltage is written to the source electrode of the driving transistor M1, and ultimately the hysteresis characteristic according to the change of the grayscale may be improved.

On the other hand, the data voltage of the previous frame is applied to a plurality of driving transistors such that each gate-source voltage of a plurality of driving transistors may be a different level before writing the data voltage of the current frame.

In an exemplary embodiment, the source voltage and the drain voltage of all driving transistors are set up as the predetermined assistance voltage during the initialization period and simultaneously the gate voltage becomes the initialization voltage Vint, thereby on-biasing all driving transistors to the same condition. Accordingly, the gate voltage and the source voltage of the driving transistors of all pixels are determined according to the data voltage of the corresponding current frame in the same condition without the influence of the hysteresis characteristic.

In an exemplary embodiment, the signal controlling the switching operation of the initialization transistor M4 and the assistance transistor M7 uses the scan signal transmitted through the previous scan line of the scan line connected to the corresponding pixel line, however it is not limited thereto and a control signal supplied through a separate control line may be used. On the other hand, in the case of the pixel included in the first pixel line, the scan signal transmitted to the initialization transistor M4 and the assistance transistor M7 may be a dummy scan signal generated and transmitted in the scan driver.

The storage capacitor Cst includes the first electrode connected to the node N1 and the second electrode connected to the first power source voltage ELVDD. The storage capacitor Cst is connected to the node N1 connected to the gate electrode of the driving transistor M1 such that it stores the voltage value of the gate electrode of the driving transistor M1 according to the driving process of the pixel.

Also, the first light emission control transistor M5 of the pixel according to an exemplary embodiment includes the gate electrode connected to the corresponding light emission control line and receiving the light emission control signal EM[n], the source electrode connected to the first power source voltage ELVDD, and the drain electrode connected to the node N2.

The pixel may further include the second light emission control transistor M6, and the second light emission control transistor M6 includes the gate electrode connected to the corresponding light emission control line and receiving the light emission control signal EM[n], the source electrode connected to the node N3, and the drain electrode connected to the anode of the organic light emitting diode (OLED). The constitution of the light emission control transistor is one embodiment.

If the light emission control signal EM[n] is transmitted with the gate-on voltage level, the first light emission control transistor M5 and the second light emission control transistor M6 are turned on, and the driving current corresponding to the data voltage according to the data signal stored to the storage capacitor Cst is transmitted to the organic light emitting diode (OLED) during the data writing period, thereby emitting the light. As described above, the data voltage stored to the storage capacitor Cst has the voltage value Vdata−Vth reflected by the threshold voltage Vth such that the influence of the threshold voltage may be excluded when emitting the light by the corresponding driving current.

The transistor included in the driving circuit diagram of the pixel shown in FIG. 11 is a PMOS, however it is not limited thereto and it may be realized by an NMOS.

The detailed operation for the driving of the pixel shown in FIG. 11 will be described in a description of a timing diagram of FIG. 14 below.

Figure 12:
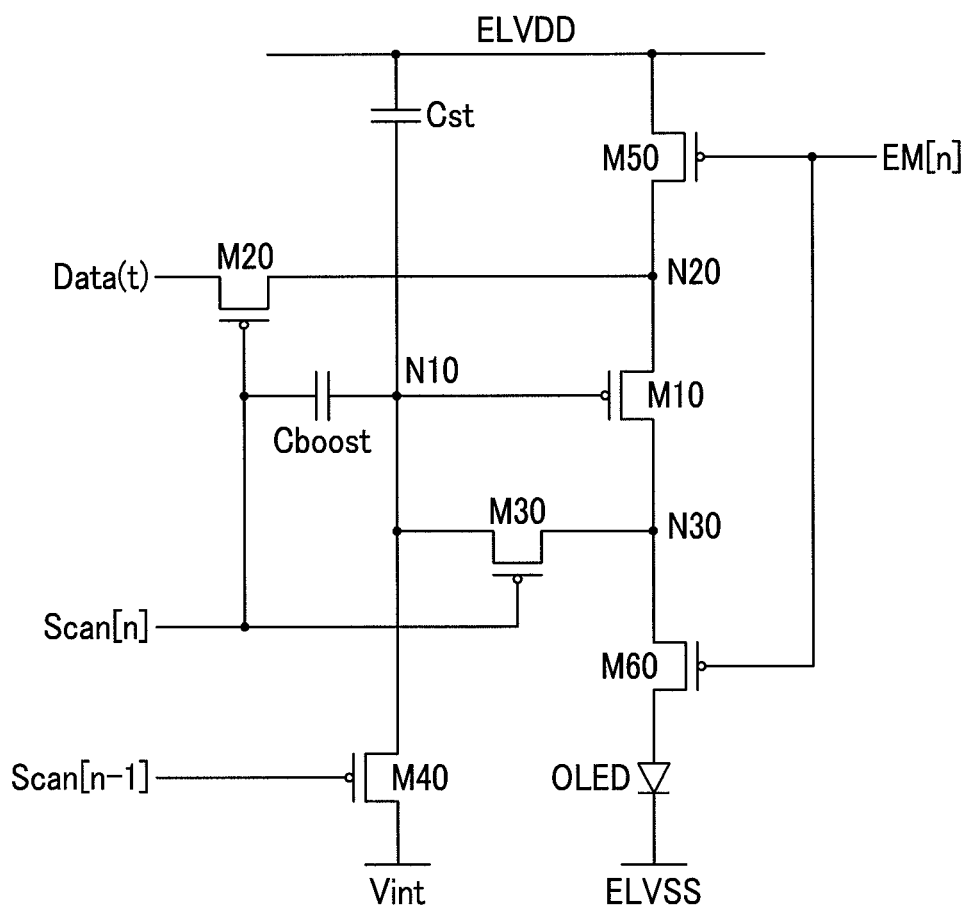
FIG. 12 is a circuit diagram of a basic structure (6TR) of a conventional pixel.

FIG. 12 is a circuit diagram of a basic structure of a pixel, and differently from FIG. 11, it may be confirmed that the driving transistor M10 is a three terminal structure including the gate, the source, and the drain. Accordingly, the driving transistor M10 consists of the conventional thin film transistor such that the bias electrode connected to the channel region of the driving transistor M10 does not exist and the assistance transistor connected to the bias electrode does not exist.

The operation process of the initialization period and the period in which the data signal is written and the constituent elements of the pixel circuit diagram in the pixel of FIG. 12 may be similar to those of FIG. 11. However, the driving transistor M10 of FIG. 12 is a three terminal structure such that the source voltage and the drain voltage of the driving transistor are not set up as the predetermined voltage before the data writing compared with FIG. 11.

Next, Table 1 is a table for comparing an efficiency characteristic of a luminance change (from a black to a white) in display devices respectively including a pixel (experimental example) in which a structure according to FIG. 11 is applied to a driving transistor and a pixel (comparative example) in which a conventional thin film transistor according to FIG. 12 is applied to a driving transistor.

TABLE 1

Efficiency characteristic according a luminance change amount

| Start −> End | Experimental Example (7TR) | Comparative Example (6TR) | Improvement ratio |
|---|---|---|---|
| 0 −> 64 | 89.87% | 62.19% | 27.68 |
| 0 −> 128 | 91.69% | 64.71% | 26.98 |
| 0 −> 192 | 93.28% | 67.28% | 26.00 |
| 0 −> 255 | 96.20% | 72.27% | 23.93 |

As shown in Table 1, when luminance is changed from a lowest grayscale 0 to a predetermined gray level, a change amount of the luminance is excellent in the experimental example of the thin film transistor of the 7TR structure of FIG. 11 is applied compared with the comparative example of FIG. 12.

As the grayscale is ultimately changed, the efficiency characteristic according to the luminance change amount is improved in the experimental example. Accordingly, the pixel including the driving transistor applied with the four terminal thin film transistor may be directly changed without the passage of the intermediate grayscale under the expression of grayscales such that it may be confirmed that the hysteresis characteristic may be superbly improved.

Figure 13:
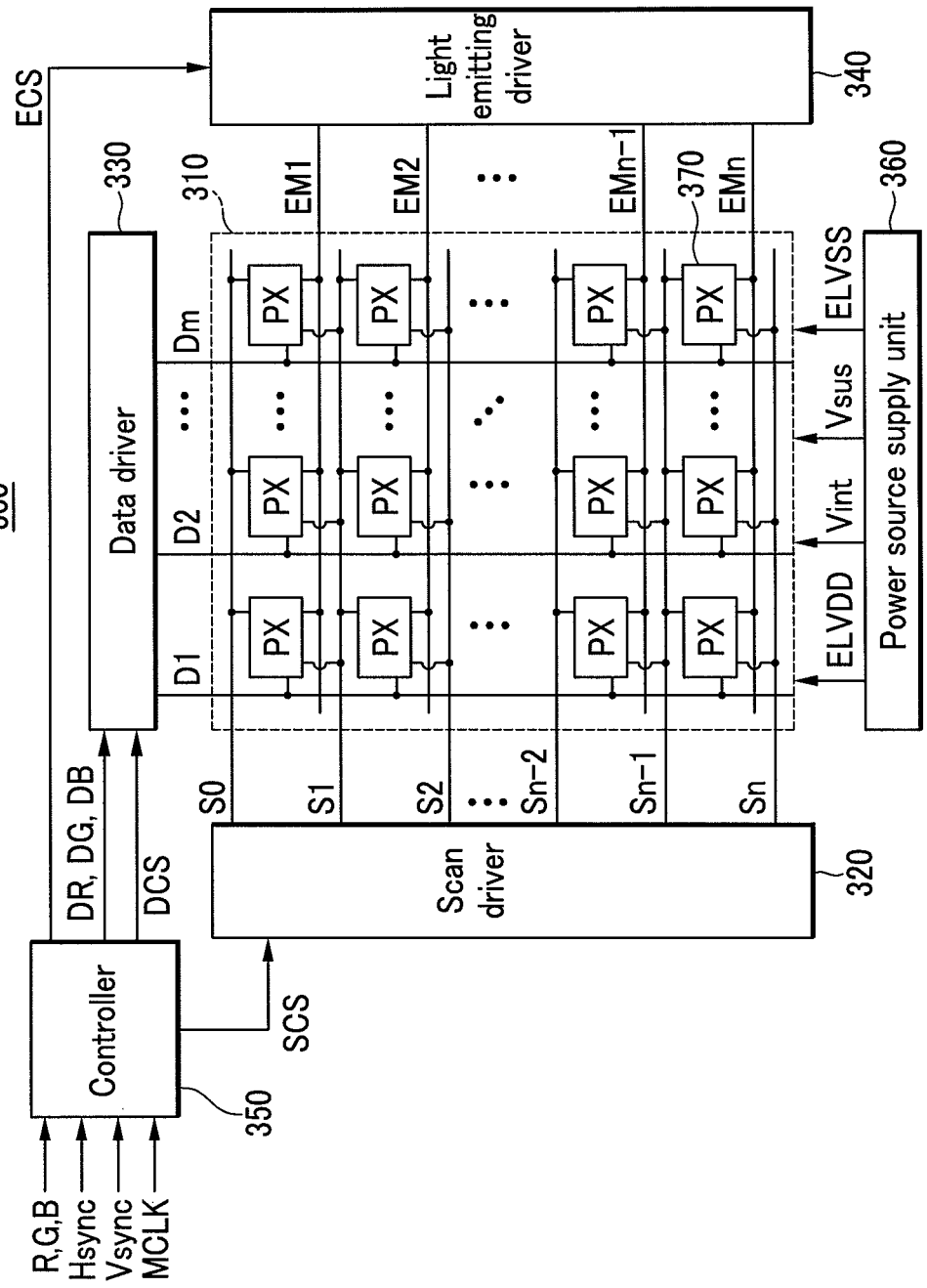
FIG. 13 is a block diagram of an organic light emitting diode (OLED) display including a pixel having a thin film transistor according to an exemplary embodiment.

FIG. 13 is a block diagram of an organic light emitting diode (OLED) display including a pixel of FIG. 11 applied with a thin film transistor according to an exemplary embodiment. A display device 300 includes a display unit 310 including a plurality of pixels, a scan driver 320, a data driver 330, a light emission driver 340, a controller 350, and a power supply unit 360 supplying an external voltage to the display device.

A plurality of pixels are respectively connected to two scan lines among a plurality of scan lines S0 to Sn connected to the display unit 310. In FIG. 13, a pixel is connected to a scan line corresponding to a corresponding pixel line and a scan line of a previous pixel line, however it is not limited thereto. Also, a plurality of pixels are respectively connected to one data line among a plurality of data lines D1 to Dm connected to the display unit 310 and one light emission control line among a plurality of light emission control lines EM1 to EMn connected to the display unit 310.

The scan driver 320 generates two corresponding scan signals and transmits them to each pixel through the plurality of scan lines S0 to Sn. That is, the scan driver 320 transmits a first scan signal through the scan line corresponding to the pixel line including the pixels and a second scan signal through the scan line of the previous pixel line of the corresponding pixel line.

In the exemplary embodiment of FIG. 13, one pixel 370 among a plurality of pixels included in the n-th pixel line is connected to the scan line Sn corresponding to the corresponding n-th pixel line and the scan line Sn−1 corresponding to the (n−1)-th pixel line previous to the n-th pixel line. One pixel 370 among a plurality of pixels included in the n-th pixel line corresponds to the pixel shown in the above-described FIG. 11.

The pixel receives the first scan signal Scan[n] through the scan line Sn and simultaneously receives the second scan signal Scan[n−1] through the scan line Sn−1. The data driver 330 transmits the data signal to each pixel through a plurality of data lines D1 to Dm. The light emission driver 340 generates the light emission control signal and transmits it to each pixel through a plurality of light emission control lines EM1 to EMn.

The controller 350 converts a plurality of video signals R, G, and B transmitted from the outside into a plurality of image data signals DR, DG, and DB and transmits them to the data driver 330. Also, the controller 350 receives a vertical synchronization signal Vsync, a horizontal synchronization signal Hsync, and a clock signal MCLK to generate and transmit control signals to control the driving of the scan driver 320, the data driver 330, and the light emission driver 340. That is, the controller 350 generates and transmits a scan driver control signal SCS controlling the scan driver 320, a data driving control signal DCS controlling the data driver 330, and a light emitting driving control signal ECS controlling the light emission driver 340.

Also, the display unit 310 includes a plurality of pixels positioned at a crossing region of a plurality of scan lines S0 to Sn, a plurality of data lines D1 to Dm, and a plurality of light emission control lines EM1 to EMn.

A plurality of pixels receive external voltages such as the first power source voltage ELVDD, the second power source voltage ELVSS, the initialization voltage VINT, the assistance voltage Vsus from a power supply unit 360. The first power source voltage ELVDD has a higher voltage level than the second power source voltage ELVSS.

The display unit 310 includes a plurality of pixels arranged in an approximately matrix. It is not limited thereto, however a plurality of scan lines S0 to Sn extend in an approximate row direction and approximately parallel to each other, and a plurality of data line D1 to Dm extend in an approximate column direction and approximately parallel to each other. A plurality of pixels emit light of a predetermined luminance by the driving current supplied to the organic light emitting diode (OLED) according to the corresponding data signal transmitted through a plurality of data lines D1 to Dm.

Figure 14:
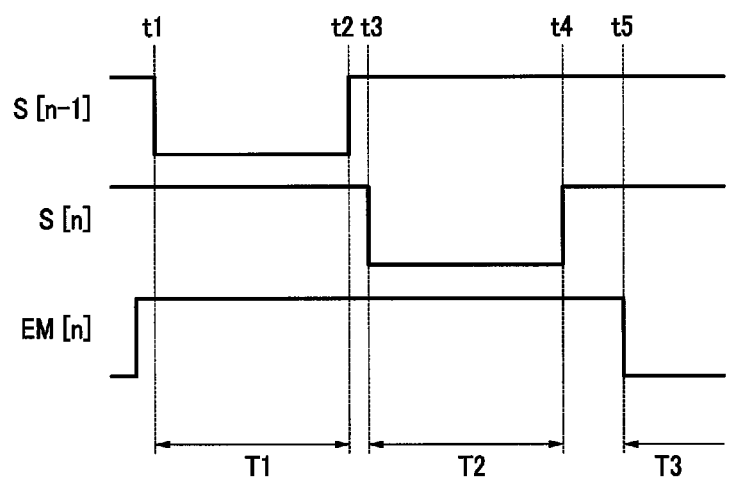
FIG. 14 is a timing diagram of a pixel driving operation of an organic light emitting diode (OLED) display shown in FIG. 13.

FIG. 14 is a timing diagram of a pixel driving operation of an organic light emitting diode (OLED) display shown in FIG. 13, and a driving process of the pixel having the circuit structure of FIG. 11 will be described in detail with reference to FIG. 14. As described above in FIG. 11, the pixel is connected to two neighboring scan lines such that it receives the scan signals and is operated.

At the time t1, the scan signal S[n−1] transmitted through the n−1-th scan line is changed to the low level and maintains the low level during the period T1. In the pixel, the initialization transistor M4 and the assistance transistor M7 receiving the scan signal S[n−1] are simultaneously turned on. Thus, during the period T1, the gate electrode of the driving transistor M1 is applied with the initialization voltage Vint through the initialization transistor M4. The source electrode and the drain electrode of the driving transistor M1 become floated by the off state of the transistors connected thereto. At this time, the floated source electrode and drain electrode of the driving transistor M1 are applied with the assistance voltage Vsus through the bias electrode connected to the channel region of the driving transistor M1. The assistance voltage Vsus is transmitted through the turned on assistance transistor M7 during the period T1.

The source electrode and the drain electrode of the driving transistor M1 are set up as a predetermined voltage before the data writing by the assistance voltage Vsus applied to the channel region of the driving transistor M1 and the voltage difference between the source electrode and the drain electrode of the driving transistor M1 is eliminated. The voltage of the predetermined level is applied before the data writing according to the data signal such that the grayscale is directly changed without the passage of the intermediate grayscale when displaying the ultimate grayscale change, and thereby the target grayscale may be correctly displayed. Accordingly, the hysteresis characteristic may be remarkably improved.

On the other hand, during the period T1, the gate voltage of the driving transistor M1 is applied with the initialization voltage Vint such that the difference Vgs between the gate voltage and the source voltage may be constantly maintained before the data writing. In each frame, before the period in which the threshold voltage of the driving transistor M1 is compensated and the data is written, the electrode voltage of the driving transistor M1 included in all pixels is set up as the predetermined voltage such that the image expressed with the targeted grayscale may be realized without the influence of the hysteresis characteristic of the driving transistor M1.

At the time t2, the scan signal S[n−1] is transitioned to the high level, and the scan signal S[n] transmitted through the n-th scan line is changed to the low level at the time t3 and maintains the low level during the period T2. The scan signal S[n−1] is transmitted with the high state during the period T2 such that the initialization transistor M4 and the assistance transistor M7 are turned off and the voltage of the node N1 becomes floated.

Also during the period T2, the switching transistor M2 and the threshold voltage compensation transistor M3 transmitted with the scan signal S[n] are turned on. Thus, during the period T2, the source electrode of the driving transistor M1 is transmitted with the data voltage Vdata according to the data signal Date(t) through the switching transistor M2, and the driving transistor M1 is diode-connected by the threshold voltage compensation transistor M3.

Accordingly, the voltage maintained at the node N1 connected to one terminal of the storage capacitor Cst during the period T2 is the voltage Vgs corresponding to the voltage difference between the gate electrode and the source electrode of the driving transistor M1, that is, the voltage value Vdata−Vth of which the data voltage Vdata is decreased by the threshold voltage Vth of the driving transistor Md.

During the initialization period of the period T1, the driving transistor M1 is applied with the assistance voltage to improve the hysteresis characteristic such that the delay of the response speed may be solved under the expression of grayscales according to the data voltage Vdata. If the scan signal S[n] is transited into the high level at the time t4, the switching transistor M2 and the threshold voltage compensation transistor M3 are turned off. Thus, the voltage of the node N1 again becomes floated.

The light emission control signal EM[n] transmitted to the pixel included in the n-th pixel line is changed to the low level at the time t5. Thus, the first light emission control transistor M5 and the second light emission control transistor M6 of the pixel transmitted with the light emission control signal EM[n] are turned on, and the driving current of the data voltage according to the data signal stored to the storage capacitor Cst is transmitted to the organic light emitting diode (OLED), thereby emitting the light.

The pixel and the display device including the same may eliminate the influence of the threshold voltage of the driving transistor and may simultaneously solve the problem of the response speed due to the hysteresis characteristic when displaying the image according to the data signal such that the response speed is not delayed and the light is emitted with the desired luminance in the corresponding frame, thereby providing a clear and high quality image.

Particularly, when the data is changed from the previous frame to the corresponding frame, although the luminance is ultimately changed, the assistance voltage is applied through the bias electrode before the writing of the data of the corresponding frame such that the source electrode and the drain electrode are set up as the predetermined voltage through the channel region, and thereby the hysteresis characteristic may be improved.

The drawings and the detailed description described above are examples and are provided to explain various features and aspects, and the scope of the present invention is not limited thereto. Therefore, it will be appreciated to those skilled in the art that various modifications may be made and other equivalent embodiments are available. In addition, some of the components described in the specification may be omitted without the deterioration of the performance or added in order to improve the performance by those skilled in the art. Moreover, the sequence of the steps of the method described in the specification may be changed depending on a process environment or equipment by those skilled in the art.

What is claimed is:

1. A pixel comprising:
   an organic light emitting diode (OLED);
   a driving transistor including:
      a source electrode and a drain electrode respectively connected to a source region and a drain region,
      a gate electrode connected to a gate metal layer formed separately from the semiconductor layer, and
      a bias electrode connected to a portion of a channel region of the semiconductor layer, wherein the driving transistor is configured to transmit a driving current according to a data signal to the organic light emitting diode (OLED);
   a switching transistor transmitting a data signal to the source electrode of the driving transistor corresponding to a first scan signal;
   an initialization transistor configured to apply an initialization voltage to the gate electrode of the driving transistor according to a second scan signal during an initialization period;
   an assistance transistor configured to apply an assistance voltage to the bias electrode of the driving transistor according to the second scan signal during the initialization period; and
   a storage capacitor including a first electrode connected to the gate electrode of the driving transistor and a second electrode connected to a first power source voltage.

2. The pixel of claim 1, wherein a voltage difference between the gate electrode voltage and the source electrode voltage of the driving transistor during the initialization period is a voltage operating the driving transistor.

3. The pixel of claim 1, wherein the second scan signal is a scan signal transmitted to a scan line previous to the scan line transmitted with the first scan signal.

4. The pixel of claim 1, wherein the second scan signal is applied with a gate-on voltage level during the initialization period.

5. The pixel of claim 1, further comprising a threshold voltage compensation transistor configured to operate according to the first scan signal after the initialization period to diode-connect the gate electrode and the drain electrode of the driving transistor and to compensate for a threshold voltage of the driving transistor.

6. The pixel of claim 1, further comprising at least one light emission control transistor between a supply source of the first power source voltage and the organic light emitting diode (OLED) and including a gate electrode configured to receive a light emission control signal to control the light emission of the organic light emitting diode (OLED).

7. The pixel of claim 6, wherein the light emission control signal is transmitted with a gate-on voltage level after the first scan signal and the second scan signal are each transmitted to the pixel with the gate-on voltage level, and are then transmitted with a gate-off voltage level.

8. The pixel of claim 1, wherein the channel region of the driving transistor includes a first connection extended in a first direction, and the bias electrode is connected to the first connection.

9. The pixel of claim 8, wherein the channel region further includes at least one second connection extended in a second direction and at least one additional bias electrode is connected to the second connection.

10. The pixel of claim 9, wherein at least one additional bias electrode applies the same voltage as the assistance voltage to the second connection.

11. The pixel of claim 8, wherein:
   the first connection includes an electrode connection connected to the bias electrode and an extension connecting the electrode connection and the channel region, and
   the width of the electrode connection is equal to or less than the width of the extension.

12. An organic light emitting diode (OLED) display comprising:
   a display unit including a plurality of pixels connected to a plurality of scan lines transmitting a plurality of scan signals, a plurality of data lines transmitting a plurality of data signals, and a plurality of light emission control lines transmitting a plurality of light emission control signals;
   a scan driver transmitting a plurality of scan signals;
   a data driver transmitting a plurality of data signals, and a light emission driver transmitting a plurality of light emission control signals,
   wherein the plurality of pixels respectively comprise:
      an organic light emitting diode (OLED);
      a driving transistor including
         a source electrode and a drain electrode respectively connected to a source region and a drain region,
         a gate electrode connected to a gate metal layer formed separately from the semiconductor layer, and
         a bias electrode connected to a portion of a channel region of the semiconductor layer,
         wherein the driving transistor is configured to transmit a driving current according to a data signal to the organic light emitting diode (OLED);
      a switching transistor configured to transmit a data signal to the source electrode of the driving transistor corresponding to a first scan signal;
      an initialization transistor configured to apply an initialization voltage to the gate electrode of the driving transistor according to a second scan signal during an initialization period;
      an assistance transistor configured to apply an assistance voltage to the bias electrode of the driving transistor according to the second scan signal during the initialization period; and
      a storage capacitor including a first electrode connected to the gate electrode of the driving transistor and a second electrode connected to a first power source voltage.

13. The organic light emitting diode (OLED) display of claim 12, wherein the second scan signal is transmitted to the scan line previous to the scan line receiving the first scan signal.

14. The organic light emitting diode (OLED) display of claim 12, wherein the plurality of pixels comprise:
- a threshold voltage compensation transistor configured to operate according to the first scan signal after the initialization period to diode-connect the gate electrode and the drain electrode of the driving transistor and to compensate for a threshold voltage of the driving transistor; and
- at least one light emission control transistor connected between a supply source of the first power source voltage and the organic light emitting diode (OLED) and including a gate electrode configured, to receive a light emission control signal to control the light emission of the organic light emitting diode (OLED).

* * * * *